United States Patent
Li

(10) Patent No.: US 11,024,819 B2
(45) Date of Patent: Jun. 1, 2021

(54) QLED DISPLAY PANEL AND PREPARATION METHOD THEREOF AND DISPLAY APPARATUS

(71) Applicant: BOE Technology Group Co., Ltd., Beijing (CN)

(72) Inventor: Dong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 231 days.

(21) Appl. No.: 16/420,705

(22) Filed: May 23, 2019

(65) Prior Publication Data

US 2020/0044174 A1 Feb. 6, 2020

(30) Foreign Application Priority Data

Aug. 3, 2018 (CN) .......................... 201810879629.6

(51) Int. Cl.
*H01L 51/50* (2006.01)
*H01L 51/00* (2006.01)
*H01L 51/56* (2006.01)

(52) U.S. Cl.
CPC ...... *H01L 51/5004* (2013.01); *H01L 51/0085* (2013.01); *H01L 51/0086* (2013.01); *H01L 51/0091* (2013.01); *H01L 51/502* (2013.01); *H01L 51/56* (2013.01); *H01L 51/0003* (2013.01); *H01L 51/0008* (2013.01); *H01L 2251/552* (2013.01)

(58) Field of Classification Search
None
See application file for complete search history.

(56) References Cited

U.S. PATENT DOCUMENTS

2016/0293857 A1\* 10/2016 Huang ................. C07D 403/14

\* cited by examiner

*Primary Examiner* — Gregory D Clark
(74) *Attorney, Agent, or Firm* — Arent Fox LLP; Michael Fainberg

(57) ABSTRACT

Disclosed are a QLED display panel and a preparation method thereof and a display apparatus. The QLED display panel includes: a first and second substrates oppositely disposed; a first electrode, a hole injection layer, a hole transport layer, a quantum dot luminescent layer, an electron transport layer and a second electrode formed between the first and second substrates and disposed sequentially along a direction from the first substrate to the second substrate; and a first ionic coordination compound layer formed on a side facing quantum dot luminescent layer, of hole transport layer. The first ionic coordination compound layer includes a first positive and a first negative ion portions; the first positive ion portion is on a side close to hole transport layer, of first ionic coordination compound layer, and the first negative ion portion is on a side close to quantum dot luminescent layer, of first ionic coordination compound layer.

15 Claims, 3 Drawing Sheets

QLED DISPLAY PANEL AND PREPARATION METHOD THEREOF AND DISPLAY APPARATUS

CROSS-REFERENCE TO RELATED APPLICATION

This application claims priority of Chinese Patent Application No. 201810879629.6, filed on Aug. 3, 2018, which is hereby incorporated by reference in its entirety.

FIELD

The present disclosure relates to the field of displaying, and more particularly relates to a Quantum Dot Light Emitting Diode (QLED) display panel and a preparation method thereof and a display apparatus.

BACKGROUND

As a novel luminescent material, a Quantum Dot (QD) has advantages of high light excitation purity, high luminescent quantum efficiency, adjustable luminescent color, long service life and the like, and has become a research hotspot of luminescent materials in novel light emitting diodes at the present. Therefore, Quantum Dot Light Emitting Diodes (QLEDs) with quantum dot materials serving as luminescent layers have become the main research direction of current novel display devices.

SUMMARY

The present disclosure provides the following technical solution:

a QLED display panel, including:
a first substrate and a second substrate which are oppositely disposed;
a first electrode, a hole injection layer, a hole transport layer, a quantum dot luminescent layer, an electron transport layer and a second electrode which are formed between the first substrate and the second substrate and disposed sequentially along a direction from the first substrate to the second substrate; and the QLED display panel further including:
a first ionic coordination compound layer formed on the side facing the quantum dot luminescent layer, of the hole transport layer, wherein the first ionic coordination compound layer includes a first positive ion portion and a first negative ion portion, the first positive ion portion is on a side close to the hole transport layer, of the first ionic coordination compound layer, and the first negative ion portion is on a side close to the quantum dot luminescent layer, of the first ionic coordination compound layer.

Optionally, the display panel further includes at least one of following structures: a second ionic coordination compound layer formed on a side facing the electron transport layer, of the quantum dot luminescent layer, wherein the second ionic coordination compound layer comprises a second positive ion portion and a second negative ion portion, wherein the second positive ion portion is on a side close to the quantum dot luminescent layer, of the second ionic coordination compound layer, and the second negative ion portion is on a side close to the electron transport layer, of the second ionic coordination compound layer; and,
a third ionic coordination compound layer formed on a side facing the second electrode, of the electron transport layer, wherein comprises a third positive ion portion and a third negative ion portion, wherein the third positive ion portion is on a side close to the electron transport layer, of the third ionic coordination compound layer, and the third negative ion portion is on a side close to the second electrode, of the third ionic coordination compound layer.

Optionally, a material of the ionic coordination compound layer is an organic metal coordination compound.

Optionally, the first positive ion portion includes a central metal ion and a ligand of the central metal ion. The central metal ion includes one of Ir, La, Nd, Eu, Cu, In, Pb, or Pt; the ligand of the central metal iron includes one of o-phenanthroline, an o-phenanthroline halide, 2-phenylpyridine, a 2-phenylpyridine halide, phenyloxadiazolypyridine, a phenyloxadiazolypyridine halide, phenylpyridine, a phenylpyridine halide, bipyridine, a bipyridine halide or a trihalomethyl substituendum;

the first negative ion portion includes one of tetra(pentafluorophenyl)boric acid, a tetra(pentafluorophenyl)boric acid halide, tetra[(trifluoromethyl)phenyl]boric acid, a tetra[(trifluoromethyl)phenyl]boric acid halide, tetra[bis(trifluoromethyl)phenyl]boric acid, a tetra[bis(trifluoromethyl)phenyl]boric acid halide, hexa(pentafluorophenyl)phosphoric acid, a hexa(pentafluorophenyl)phosphoric acid halide, hexa[(trifluoromethyl)phenyl]phosphoric acid, a hexa[(trifluoromethyl)phenyl]phosphoric acid halide, hexa[bis(trifluoromethyl)phenyl]phosphoric acid and a hexa[bis(trifluoromethyl)phenyl]phosphoric acid halide or a trihalomethyl substituendum.

Optionally, the first positive ion portion comprises one of following structures:

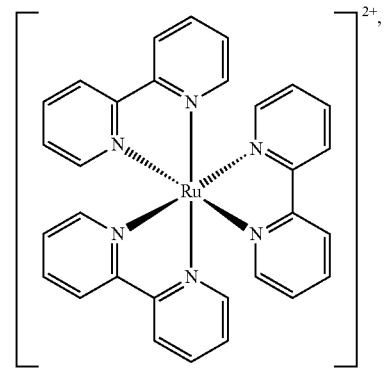

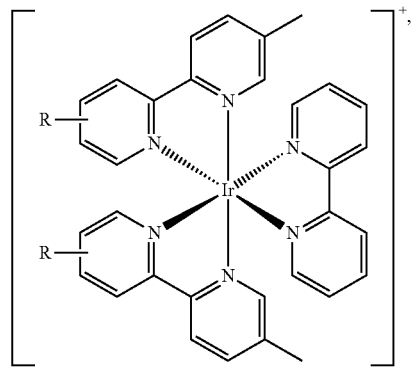

-continued

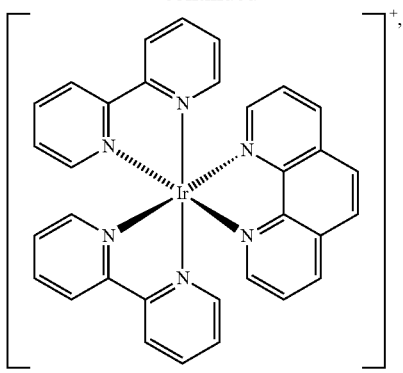

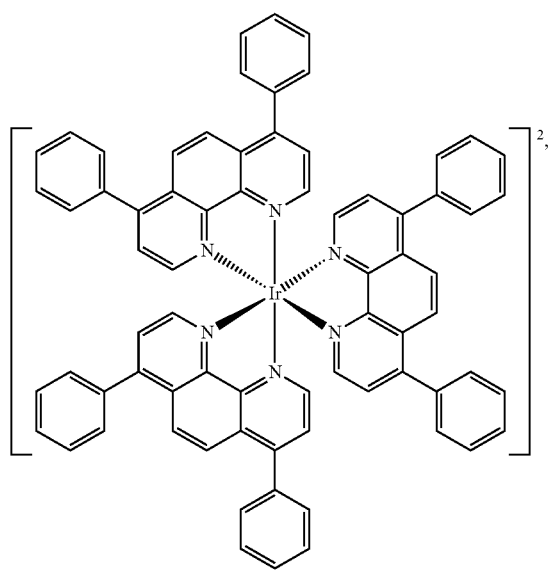

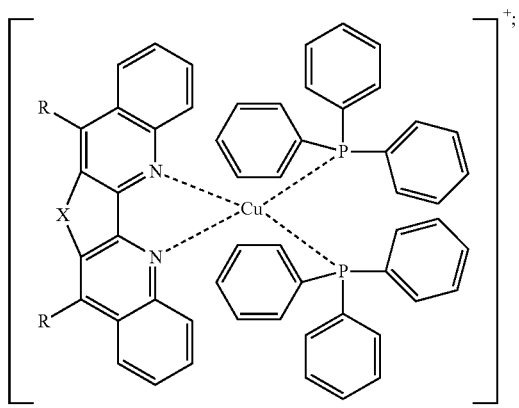

the first negative ion portion comprises one of following structures:

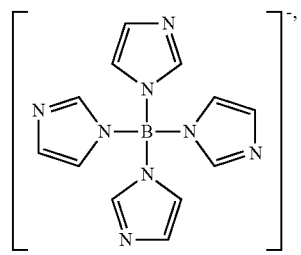

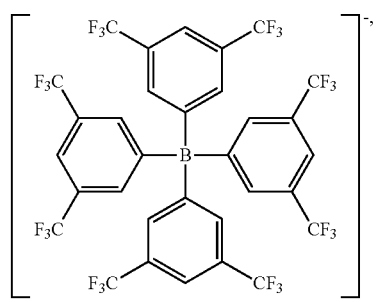

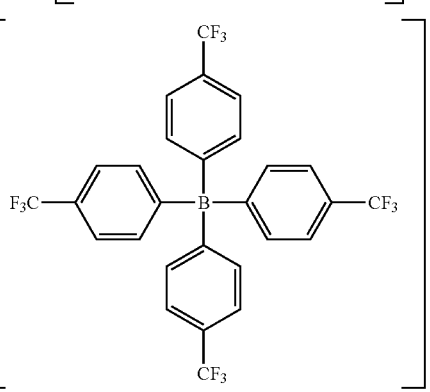

or

[pentafluorophenyl borate structure]

The present disclosure further provides a preparation method of a Quantum Dot Light Emitting Diode (QLED) display panel, including:
 forming a first electrode on a first substrate;
 forming a hole injection layer on the first electrode;
 forming a hole transport layer on the hole injection layer;
 forming a first ionic coordination compound layer on the hole transport layer;
 forming a quantum dot luminescent layer on the first ionic coordination compound layer;

forming an electron transport layer on the quantum dot luminescent layer;

forming a second electrode on the electron transport layer;

wherein a first positive ion portion of the first ionic coordination compound layer is on a side close to the hole transport layer, of the first ionic coordination compound layer, and a first negative ion portion of the first ionic coordination compound layer is on a side close to the quantum dot luminescent layer, of the first ionic coordination compound layer.

Optionally, the method of forming the first ionic coordination compound layer includes: depositing a middle thin film layer of ionic coordination compound on the hole transport layer;

applying an external electric field in a deposition process so that the first positive ion portion is on the side close to the hole transport layer, of the first ionic coordination compound layer, and a first negative ion portion is on the side close to the quantum dot luminescent layer, of the first ionic coordination compound layer; and under a condition of continuously applying the external electric field, baking the middle thin film layer through a baking process to form the first ionic coordination compound layer.

Optionally, the forming the first ionic coordination compound layer includes:

depositing a middle thin film layer of ionic coordination compound on the hole transport layer;

applying an external electric field in the deposition process so that the first positive ion portion is on the side close to the hole transport layer, of the first ionic coordination compound layer, and a first negative ion portion is on the side close to the quantum dot luminescent layer, of the first ionic coordination compound layer;

removing the external electric field; and baking the middle thin film layer through a baking process to form the first ionic coordination compound layer.

Optionally, the forming the first ionic coordination compound layer includes:

depositing a middle thin film layer of ionic coordination compound on the hole transport layer;

baking the middle thin film layer through a baking process, and applying an external electric field in the baking process so that the first positive ion portion is on the side close to the hole transport layer, of the first ionic coordination compound layer, and a first negative ion portion is on the side close to the quantum dot luminescent layer, of the first ionic coordination compound layer to form the first ionic coordination compound layer.

Optionally, the depositing the middle thin film layer of ionic coordination compound on the hole transport layer includes:

depositing the middle thin film layer of ionic coordination compound on the hole transport layer through a spin-coating process; or, depositing the middle thin film layer of ionic coordination compound on the hole transport layer through an evaporation process.

The present disclosure further provides a Quantum Dot Light Emitting Diode (QLED) display apparatus, including the QLED display panel in any one of the above-mentioned technical solutions.

DETAILED DESCRIPTION OF THE EMBODIMENTS

The technical solutions in some embodiments of the present disclosure are clearly and completely described below in combination with the accompanying drawings in some embodiments of the present disclosure. It is obvious that the described embodiments are only a part of some embodiments of the present disclosure, but not all embodiments. All other embodiments obtained by those of ordinary skill in the art based on some embodiments of the present disclosure without creative effort are within the scope of the present disclosure.

Figure 1:
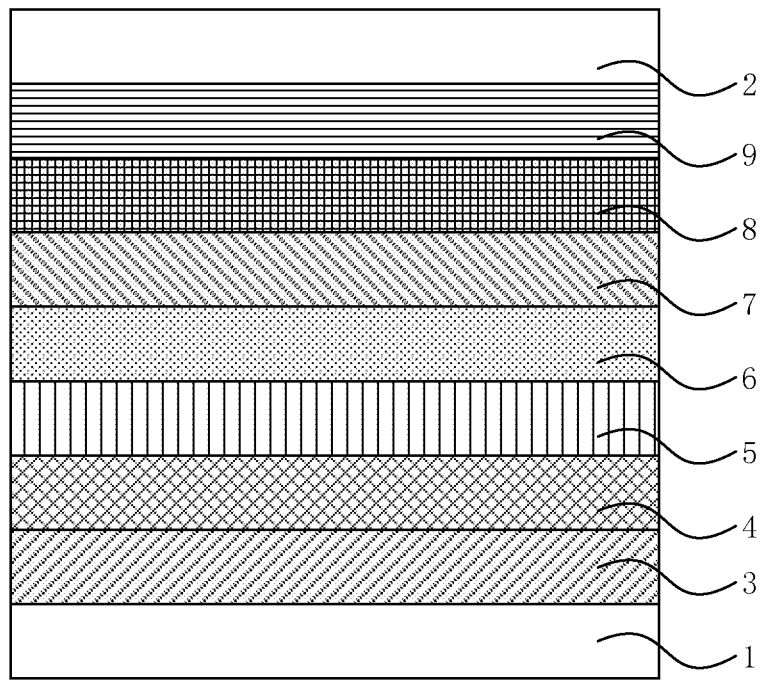
FIG. 1 is a structural schematic diagram of a Quantum Dot Light Emitting Diode (QLED) display panel provided by some embodiments of the present disclosure.

Referring to FIG. 1, the present disclosure provides a Quantum Dot Light Emitting Diode (QLED) display panel, including:

a first substrate 1 and a second substrate 2 which are oppositely disposed;

a first electrode 3, a hole injection layer 4, a hole transport layer 5, a quantum dot luminescent layer 7, an electron transport layer 8 and a second electrode 9 which are formed between the first substrate 1 and the second substrate 2 and are disposed along a direction from the first substrate 1 to the second substrate 2; the QLED display panel further including:

a first ionic coordination compound layer 6 formed on the side of the hole transport layer 5 facing the quantum dot luminescent layer 7, wherein the first ionic coordination compound layer 1 has a first build-in electric field, and the side of the first build-in electric field close to the hole transport layer 5 is a positive electrode, and the side of the first build-in electric field close to the quantum dot luminescent layer 7 is a negative electrode.

Figure 2A:
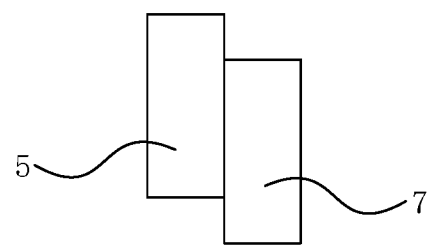
FIG. 2A is a schematic diagram of energy levels of a hole transport layer and a quantum dot luminescent layer in a QLED display panel in the related art.
Figure 2B:
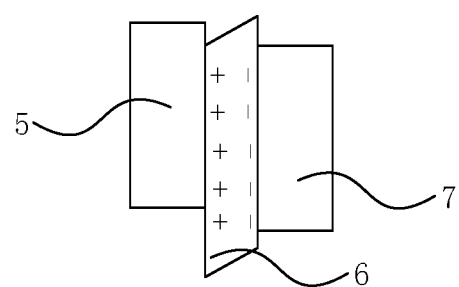
FIG. 2B is a schematic diagram of energy levels of a hole transport layer and a quantum dot luminescent layer in the QLED display panel provided by some embodiments of the present disclosure.

According to the above-mentioned QLED display panel, the QLED display panel includes the first substrate 1 and the second substrate 2 which are oppositely disposed, and the first electrode 3, the hole injection layer 4, the hole transport layer 5, the first ionic coordination compound layer 6, the quantum dot luminescent layer 7, the electron transport layer 8 and the second electrode 9 which are formed between the first substrate 1 and the second substrate 2 and are disposed along the direction from the first substrate 1 to the second substrate 2. Furthermore, the first ionic coordination compound layer 6 has the first build-in electric field, and the side of the first build-in electric field close to the hole transport layer 5 is the positive electrode, and the side of the first build-in electric field close to the quantum dot luminescent layer 7 is the negative electrode, so that the first build-in electric field may change the vacuum energy levels of interfaces of the quantum dot luminescent layer 7 and the hole transport layer 5, reduce the potential barriers (as shown in FIGS. 2A and 2B) of the HOMO energy levels of the two layers (the quantum dot luminescent layer and the hole transport layer) and improve the efficiency of injecting holes into the quantum dot luminescent layer 7, thereby improving the carrier balance in the quantum dot luminescent layer 7.

In addition, it should be noted that an electron occupied orbit that has the highest energy level is called the highest occupied molecular orbit and represented by HOMO.

The QLED display panel provided by the present disclosure may increase the injection of the holes from the hole transport layer 5 to the quantum dot luminescent layer 7 and balance carriers in the quantum dot luminescent layer 7 by adding the ionic coordination compound layer, thereby improving the efficiency and life of the QLED display panel.

Therefore, the QLED display panel solves the problem of uncalm carriers in the QLED display panel due to different efficiencies of injecting the holes and electrons into the quantum dot luminescent layer 7.

Optionally, the first substrate 1 may be a glass or flexible polyethylene terephthalate (PET) substrate. The first electrode 3 may be made of transparent indium tin oxide (ITO), FTO or a conductive polymer and the like, and may be also a non-transparent metal electrode made of Al, Ag and the like. The hole injection layer 4 may be made of an organic injection material such as PEDOT: PSS, and may be also made of an inorganic oxide such as MoOx. The hole transport layer 5 may be made of an organic matter such as polyvinyl carbazole (PVK), 2,4,4'-trifluorobenzophenone (TFB) and TPD, and may be also made of an inorganic oxide such as NiOx and VOx. The first choice of the material of the electron transport layer 8 is a zinc oxide particle. The second electrode 9 may be a transparent electrode such as ITO, thin Al and Ag, and may be also a non-transparent electrode such as a thick metal electrode made of Al, Ag and the like.

On the basis of the above-mentioned technical solution, it should be noted that the QLED display panel provided by the present disclosure further includes other ionic coordination compound layers in addition to the first ionic coordination compound layer 6. The specific number and forming positions of ionic coordination compound layers are at least one form of the following several structural forms.

The structural form I: the QLED display panel provided by the present disclosure further includes a second ionic coordination compound layer formed on the side of the quantum dot luminescent layer 7 facing the electron transport layer 8. The second ionic coordination compound layer has a second build-in electric field, and the side of the second build-in electric field close to the quantum dot luminescent layer 7 is a positive electrode, and the side of the second build-in electric field close to the electron transport layer 8 is a negative electrode.

The structural form II: the QLED display panel provided by the present disclosure further includes a third ionic coordination compound layer formed on the side of the electron transport layer 8 facing the second electrode 9. The third ionic coordination compound layer has a third build-in electric field, and the side of the third build-in electric field close to the electron transport layer 8 is a positive electrode, and the side of the third build-in electric field close to the second electrode 9 is a negative electrode.

It should be noted that the second ionic coordination compound layer in the structural form I or the third ionic coordination compound layer in the structural form II may achieve an effect of suppressing the electron transport of electrons from the electron transport layer 8 to the quantum dot luminescent layer 7.

Obviously, suppression of the electron transport from the electron transport layer 8 to the quantum dot luminescent layer 7 may further reduce the difference between the efficiencies of transporting the electrons and the holes into the quantum dot luminescent layer 7, thereby better improving the carrier balance in the quantum dot luminescent layer 7 and prolonging the service life of the QLED display panel.

Structural form III: the QLED display panel provided by the present disclosure further includes a second ionic coordination compound layer formed on the side of the quantum dot luminescent layer 7 facing the electron transport layer 8. The second ionic coordination compound layer has a second build-in electric field, and the side of the second build-in electric field close to the quantum dot luminescent layer 7 is a positive electrode, and the side of the second build-in electric field close to the electron transport layer 8 is a negative electrode.

Furthermore, the QLED display panel provided by the present disclosure further includes a third ionic coordination compound layer formed on the side of the electron transport layer 8 facing the second electrode 9. The third ionic coordination compound layer has a third build-in electric field, and the side of the third build-in electric field close to the electron transport layer 8 is a positive electrode, and the side of the third build-in electric field close to the second electrode 9 is a negative electrode.

It should be noted that when the QLED display panel provided by the present disclosure includes both the second ionic coordination compound layer and the third ionic coordination compound layer, the second ionic coordination compound layer and the third ionic coordination compound layer both achieve an effect of suppressing the electron transport from the electron transport layer 8 to the quantum dot luminescent layer 7, so as to better improve the carrier balance in the quantum dot luminescent layer 7 and prolong the service life of the QLED display panel.

In other words, the QLED display panel in the structural form III includes the first ionic coordination compound layer 6, the second ionic coordination compound layer and the third ionic coordination compound layer.

The first build-in electric field in the first ionic coordination compound layer 6 changes the vacuum energy levels of interfaces of the quantum dot luminescent layer 7 and the hole transport layer 5, reduces the potential barriers of the HOMO energy levels of the two layers and improve the efficiency of injecting the holes into the quantum dot luminescent layer 7; and in addition, the second build-in electric field in the second ionic coordination compound and the third build-in electric field in the third ionic coordination compound suppress the electron transport from the electron transport layer 8 to the quantum dot luminescent layer 7. The three build-in electric fields reduce the difference between the electron transport efficiency and the hole transport efficiency, which may better improve the carrier balance in the quantum dot luminescent layer 7 and prolong the service life of the QLED display panel.

On the basis of the above-mentioned technical solution, as an optional implementation mode, a material of the ionic coordination compound layer is an organic metal coordination compound.

Optionally, the ionic coordination compound layer includes a positive ion portion and a negative ion portion.

The positive ion portion includes a central metal ion and a ligand of the central metal ion. The central metal ion includes one of Ir, La, Nd, Eu, Cu, In, Pb or Pt. The ligand of the central metal ion includes one of o-phenanthroline, an o-phenanthroline halide, 2-phenylpyridine, a 2-phenylpyridine halide, phenyloxadiazolypyridine, a phenyloxadiazolypyridine halide, phenylpyridine, a phenylpyridine halide, bipyridine, a bipyridine halide or a trihalomethyl substituendum.

The negative ion portion includes one of tetra(pentafluorophenyl)boric acid, a tetra(pentafluorophenyl)boric acid halide, tetra[(trifluoromethyl)phenyl]boric acid, a tetra[(trifluoromethyl)phenyl]boric acid halide, tetra[bis(trifluoromethyl)phenyl]boric acid, a tetra[bis(trifluoromethyl)phenyl] boric acid halide, hexa(pentafluorophenyl)phosphoric acid, a hexa(pentafluorophenyl)phosphoric acid halide, hexa[(trifluoromethyl)phenyl]phosphoric acid, a hexa[(trifluoromethyl)phenyl]phosphoric acid halide, hexa[bis(trifluoromethyl)phenyl]phosphoric acid and a hexa[bis(trifluoromethyl)phenyl]phosphoric acid halide or a trihalomethyl substituendum.

Optionally, the positive ion portion may be one of the following structures:

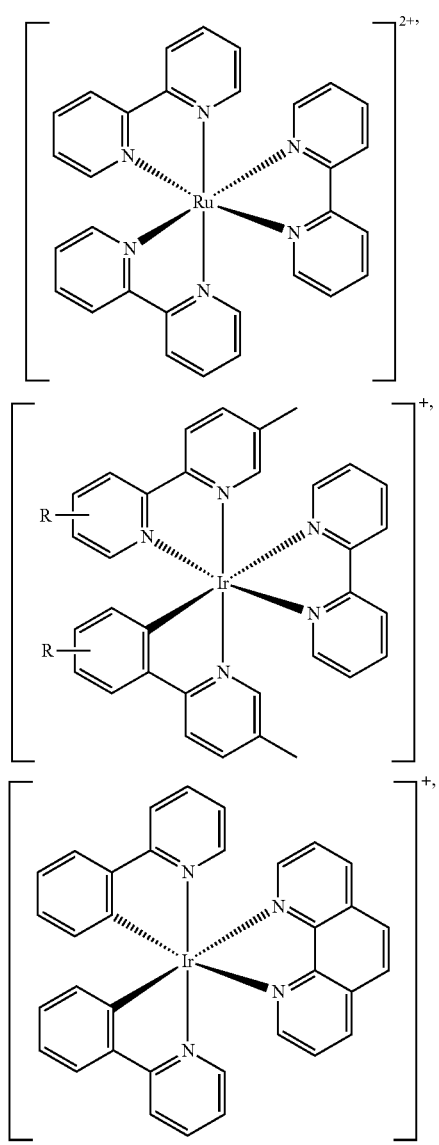

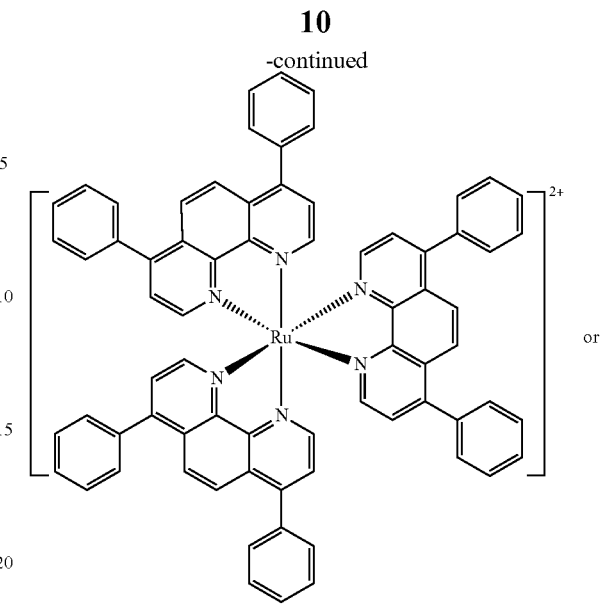

and the negative ion portion may be one of the following structures:

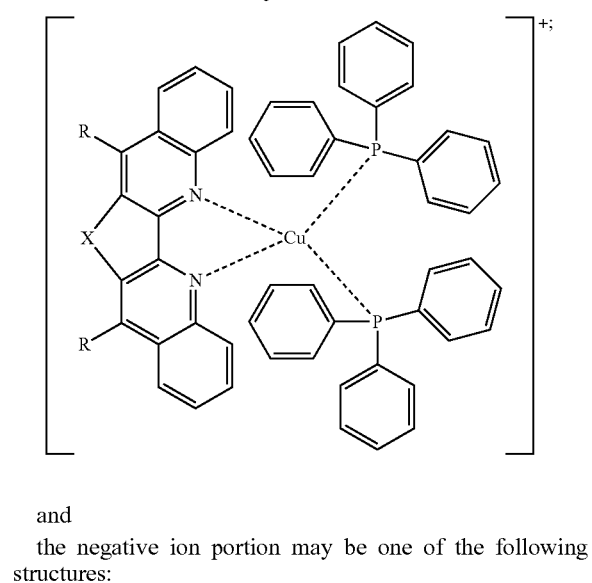

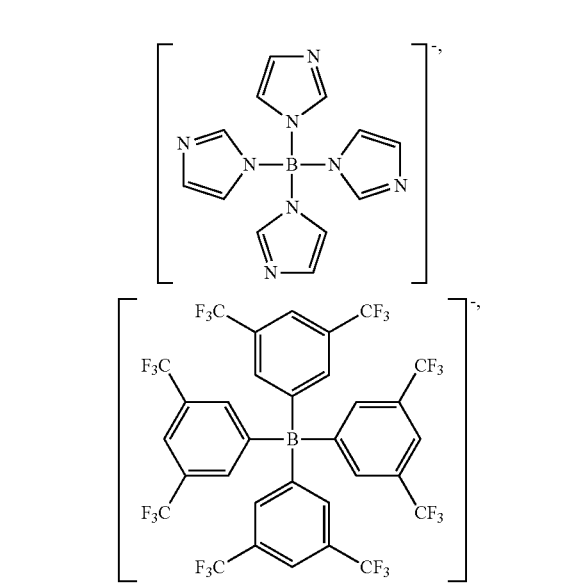

-continued

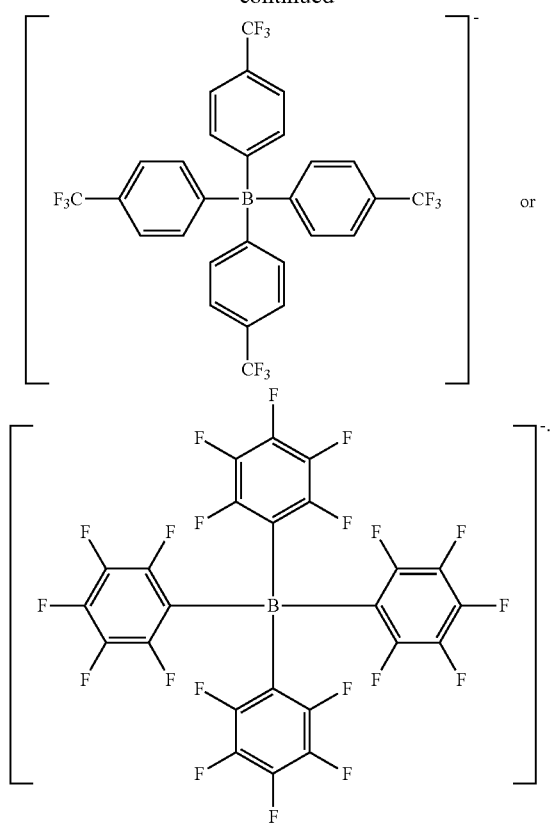 or

It should be noted that the positive ion portion and the negative ion portion both adopt materials having relatively high steric hindrance, so that the positive and negative ions in the ionic coordination compound layer may be subjected to oriented arrangement under the action of an external electric field, and may maintain the original structures after the external electric field is removed, so as to form the build-in electric field.

In addition, it should be noted that compared with traditional electrically neutral dipolar molecules, positive and negative centers of middle layers in the ionic coordination compound layers in the QLED display panel provided by the present disclosure are separated. Positive and negative ion centers may be designed, as required, into ions having different charge numbers and have larger molecular dipole moments, so that stronger build-in electric fields may be formed.

The present disclosure further provides a preparation method of a Quantum Dot Light Emitting Diode (QLED) display panel, including:

Step S101: a first electrode 3 is formed on a first substrate 1;

Step S102: a hole injection layer 4 is formed on the first electrode 3;

Step S103: a hole transport layer 5 is formed on the hole injection layer 4;

Step S104: a first ionic coordination compound layer 6 is formed on the hole transport layer 5;

Step S105: a quantum dot luminescent layer 7 is formed on the first ionic coordination compound layer 6;

Step S106: an electron transport layer 8 is formed on the quantum dot luminescent layer 7;

Step S107: a second electrode 9 is formed on the electron transport layer 8; and Step S108: a second substrate 2 is packaged on the second electrode 9.

During forming of the first ionic coordination compound layer 6, an external electric field is applied, so as to allow the first ionic coordination compound layer 6 to have a first build-in electric field after the electric field is removed. The side of the first build-in electric field close to the hole transport layer 5 is a positive electrode, and the side of the first build-in electric field close to the quantum dot luminescent layer 7 is a negative electrode.

On the basis of the technical solution, it should be noted that there are various methods of forming the first ionic coordination compound layer 6, optionally at least including one of the following several methods.

Figure 3:
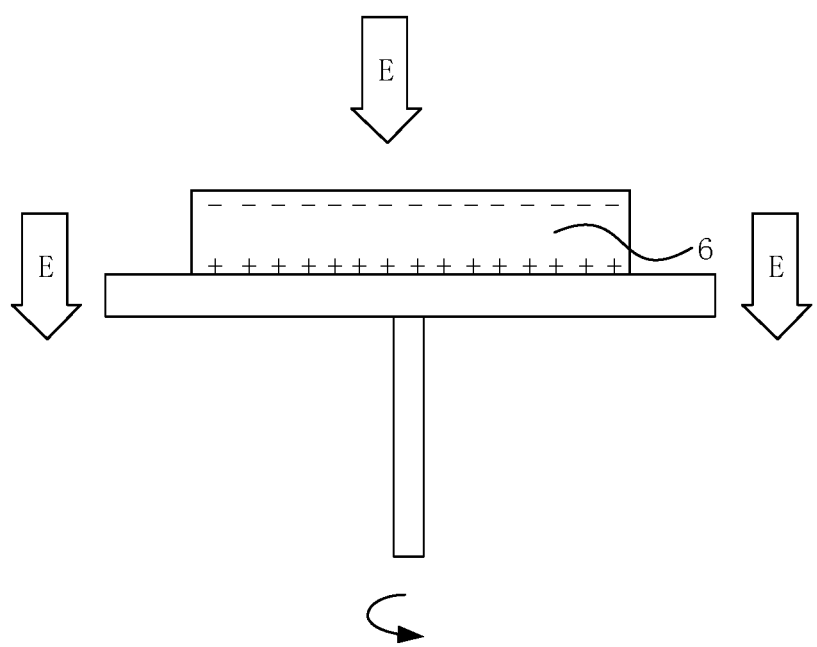
FIG. 3 is a schematic diagram of a spin-coating process in a preparation method of the QLED display panel provided by some embodiments of the present disclosure.
Figure 5:
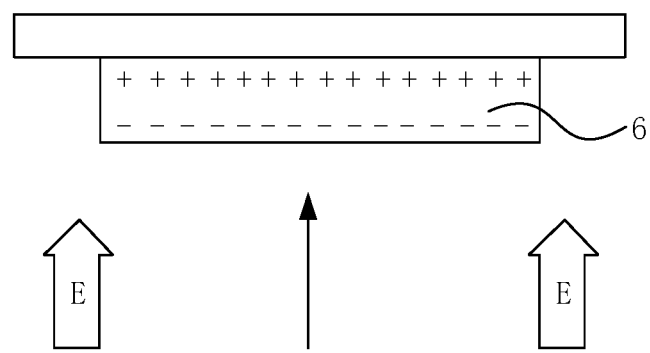
FIG. 5 is a schematic diagram of an evaporation process in the preparation method of the QLED display panel provided by some embodiments of the present disclosure.

Method I: Step S1041: the method that the first ionic coordination compound layer 6 is formed includes that:

a middle thin film layer of ionic coordination compound is deposited on the hole transport layer 5;

referring to FIGS. 3 and 5, the external electric field is applied in the deposition process to allow positive and negative ions in the middle thin layer to be subjected to oriented arrangement through the external electric field, so as to form the first build-in electric field in the middle thin film layer, wherein the positive ions are gathered on the side of the first build-in electric field close to the hole transport layer 5 to form the positive electrode, and the negative ions are gathered on the side of the first build-in electric field close to the quantum dot luminescent layer 7 to form the negative electrode; and under the condition of continuously applying the external electric field, the middle thin film layer is baked through a baking process to form the first ionic coordination compound layer 6.

Method II: Step S1042: the method that the first ionic coordination compound layer 6 is formed includes that:

a middle thin film layer of ionic coordination compound is deposited on the hole transport layer 5;

the external electric field is applied in the deposition process to allow positive and negative ions in the middle thin layer to be subjected to oriented arrangement through the external electric field, so as to form the first build-in electric field in the middle thin film layer, wherein the positive ions are gathered on the side of the first build-in electric field close to the hole transport layer 5 to form the positive electrode, and the negative ions are gathered on the side of the first build-in electric field close to the quantum dot luminescent layer 7 to form the negative electrode;

the external electric field is removed; and the middle thin film layer is baked through a baking process to form the first ionic coordination compound layer 6.

Figure 4:
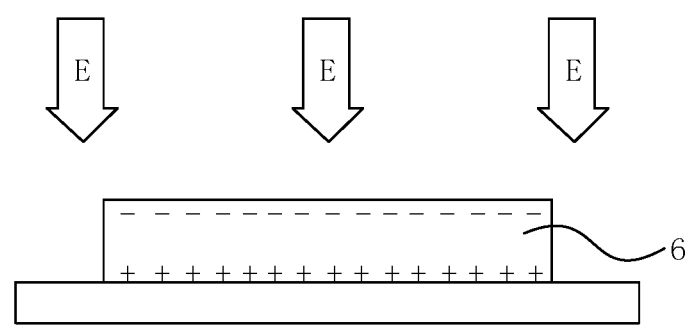
FIG. 4 is a schematic diagram of a drying process in the preparation method of the QLED display panel provided by some embodiments of the present disclosure.

Method III: Step S1043: the method that the first ionic coordination compound layer 6 is formed includes that:

a middle thin film layer of ionic coordination compound is deposited on the hole transport layer 5;

referring to FIG. 4, the middle thin film layer is baked through a baking process, and the external electric field is applied in the backing process to allow positive and negative ions in the middle thin layer to be subjected to oriented arrangement through the external electric field, so as to form the first build-in electric field in the middle thin film layer, wherein the positive ions are gathered on the side of the first build-in electric field close to the hole transport layer 5 to form the positive electrode, and the negative ions are gathered on the side of the first build-in electric field close to the quantum dot luminescent layer 7 to form the negative electrode, so as to form the first ionic coordination compound layer 6.

On the basis of the above-mentioned technical solutions, it should be noted that the method that the middle thin film layer of ionic coordination compound is deposited on the hole transport layer 5 includes that:

referring to FIG. 3, the middle thin film layer of ionic coordination compound is deposited on the hole transport layer 5 through a spin-coating process; or, referring to FIG. 5, the middle thin film layer of ionic coordination compound is deposited on the hole transport layer 5 through an evaporation process.

It should be noted that during the preparation of the second ionic compound coordination compound and the third ionic coordination compound, the preparation method of the first ionic coordination compound also may be adopted.

On the basis of the above-mentioned technical solutions, it should be noted that after the above operations are completed, a voltage opposite to the first build-in electric field (from one side, the arrangement directions of the positive electrodes and the negative electrodes of the first build-in electric field, the second build-in electric field and the third build-in electric field are the same) is applied to two ends of the QLED display panel, so as to enhance the oriented arrangement of the positive and negative ions in the ionic coordination compound layers.

The present disclosure further provides a Quantum Dot Light Emitting Diode (QLED) display apparatus, including the QLED display panel in any one of the above-mentioned technical solutions. The QLED display apparatus further includes a control circuit and a driving circuit, which are conventional for a person skilled in the art. The description for the control circuit and the driving circuit will be omitted here.

Apparently, those skilled in the art can make various modifications and variations to some embodiments of the present disclosure without departing from the spirit and scope of the present disclosure. Thus, it is also intended that the present disclosure covers these modifications and variations if these modifications and variations of the present disclosure fall within the scope of claims of the present disclosure and equivalent technologies of the present disclosure.

The invention claimed is:

1. A Quantum Dot Light Emitting Diode (QLED) display panel, comprising:
    a first substrate and a second substrate which are oppositely disposed;
    a first electrode, a hole injection layer, a hole transport layer, a quantum dot luminescent layer, an electron transport layer and a second electrode which are formed between the first substrate and the second substrate and are disposed sequentially along a direction from the first substrate to the second substrate; and
    the QLED display panel further comprising:
    a first ionic coordination compound layer formed on a side of the hole transport layer facing the quantum dot luminescent layer, the first ionic coordination compound layer comprises a first positive ion portion and a first negative ion portion;
    wherein the first positive ion portion is on a side close to the hole transport layer, of the first ionic coordination compound layer, and the first negative ion portion is on a side close to the quantum dot luminescent layer, of the first ionic coordination compound layer.

2. The QLED display panel according to claim 1, further comprises at least one of following structures:
    a second ionic coordination compound layer formed on a side facing the electron transport layer, of the quantum dot luminescent layer, wherein the second ionic coordination compound layer comprises a second positive ion portion and a second negative ion portion, wherein the second positive ion portion is on a side close to the quantum dot luminescent layer, of the second ionic coordination compound layer, and the second negative ion portion is on a side close to the electron transport layer, of the second ionic coordination compound layer; and
    a third ionic coordination compound layer formed on a side facing the second electrode, of the electron transport layer, wherein comprises a third positive ion portion and a third negative ion portion, wherein the third positive ion portion is on a side close to the electron transport layer, of the third ionic coordination compound layer, and the third negative ion portion is on a side close to the second electrode, of the third ionic coordination compound layer.

3. The QLED display panel according to claim 1, wherein a material of the ionic coordination compound layers is an organic metal coordination compound.

4. The QLED display panel according to claim 3, wherein;
    the first positive ion portion comprises a central metal ion and a ligand of the central metal ion; the central metal ion comprises one of Ir, La, Nd, Eu, Cu, In, Pb or Pt; the ligand of the central metal ion comprises one of o-phenanthroline, an o-phenanthroline halide, 2-phenylpyridine, a 2-phenylpyridine halide, phenyloxadiazolypyridine, a phenyloxadiazolypyridine halide, phenylpyridine, a phenylpyridine halide, bipyridine, a bipyridine halide or a trihalomethyl substituendum; and
    the first negative ion portion comprises one of tetra(pentafluorophenyl)boric acid, a tetra(pentafluorophenyl)boric acid halide, tetra[(trifluoromethyl)phenyl]boric acid, a tetra[(trifluoromethyl)phenyl]boric acid halide, tetra[bis(trifluoromethyl)phenyl]boric acid, a tetra[bis(trifluoromethyl)phenyl]boric acid halide, hexa(pentafluorophenyl)phosphoric acid, a hexa(pentafluorophenyl)phosphoric acid halide, hexa[(trifluoromethyl)phenyl]phosphoric acid, a hexa[(trifluoromethyl)phenyl]phosphoric acid halide, hexa[bis(trifluoromethyl)phenyl]phosphoric acid and a hexa[bis(trifluoromethyl)phenyl]phosphoric acid halide or a trihalomethyl substituendum.

5. The QLED display panel according to claim 4, wherein the first positive ion portion comprises one of following structures:

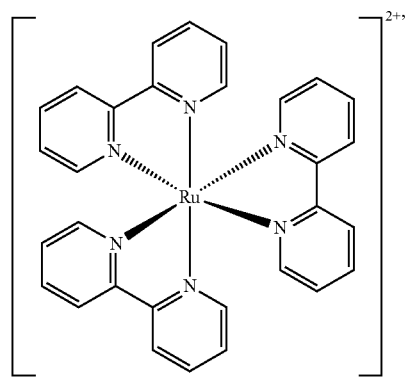

15
-continued
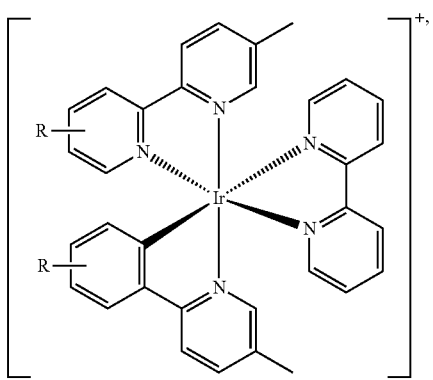
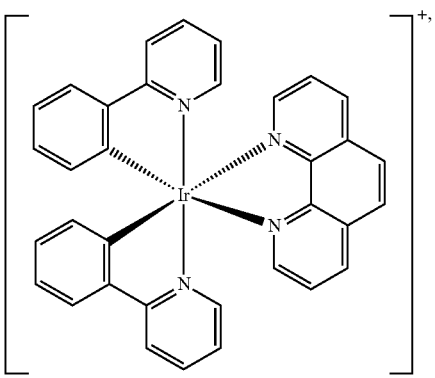
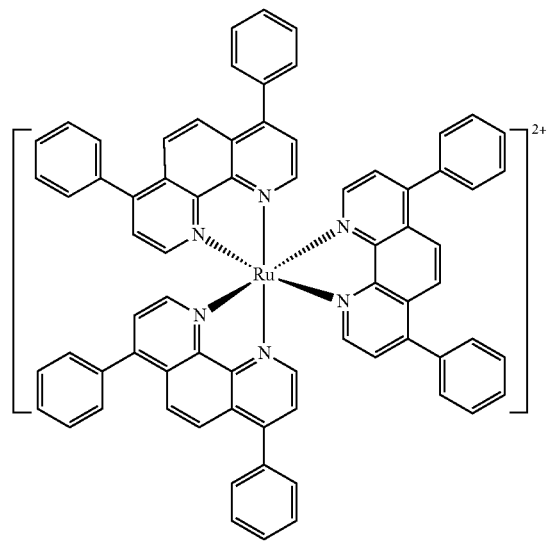
16
-continued
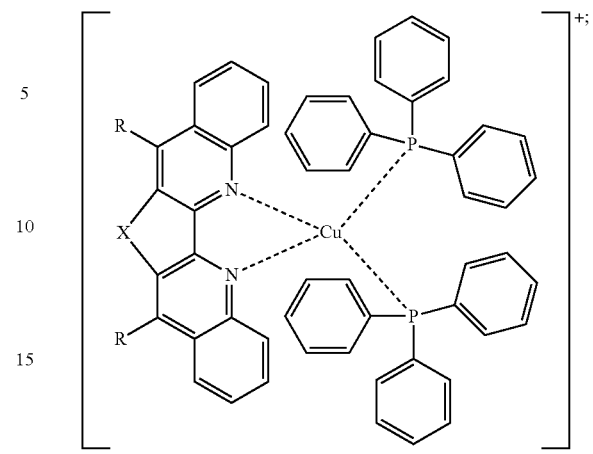
the first negative ion portion comprises one of following structures:
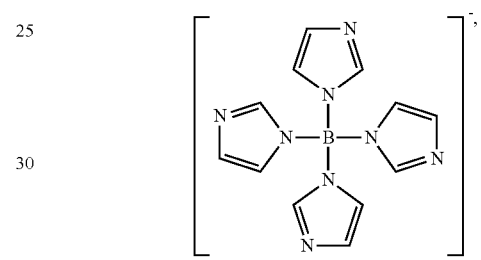
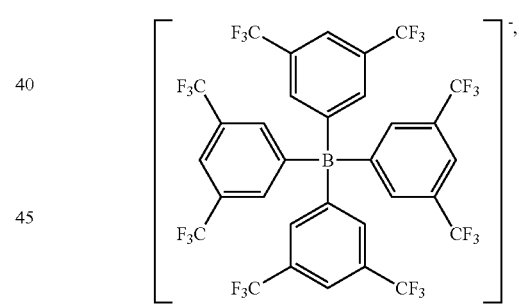
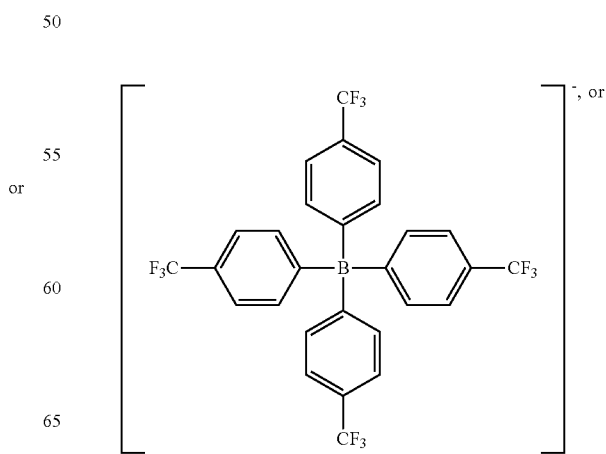

-continued

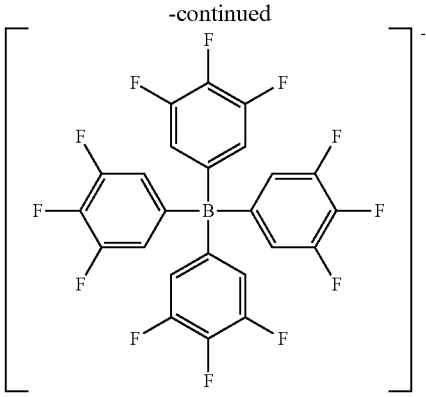

6. A preparation method of a Quantum Dot Light Emitting Diode (QLED) display panel, comprising:
    forming a first electrode on a first substrate;
    forming a hole injection layer on the first electrode;
    forming a hole transport layer on the hole injection layer;
    forming a first ionic coordination compound layer on the hole transport layer;
    forming a quantum dot luminescent layer on the first ionic coordination compound layer;
    forming an electron transport layer on the quantum dot luminescent layer;
    forming a second electrode on the electron transport layer;
    wherein a first positive ion portion of the first ionic coordination compound layer is on a side close to the hole transport layer, of the first ionic coordination compound layer, and a first negative ion portion of the first ionic coordination compound layer is on a side close to the quantum dot luminescent layer, of the first ionic coordination compound layer.

7. The preparation method according to claim 6, wherein the forming the first ionic coordination compound layer comprises:
    depositing a middle thin film layer of ionic coordination compound on the hole transport layer;
    applying an external electric field in a deposition process so that the first positive ion portion is on the side close to the hole transport layer, of the first ionic coordination compound layer, and a first negative ion portion is on the side close to the quantum dot luminescent layer, of the first ionic coordination compound layer; and
    under a condition of continuously applying the external electric field, baking the middle thin film layer through a baking process to form the first ionic coordination compound layer.

8. The preparation method according to claim 6, wherein the forming the first ionic coordination compound layer comprises:
    depositing a middle thin film layer of ionic coordination compound on the hole transport layer;
    applying an external electric field in the deposition process so that the first positive ion portion is on the side close to the hole transport layer, of the first ionic coordination compound layer, and a first negative ion portion is on the side close to the quantum dot luminescent layer, of the first ionic coordination compound layer;
    removing the external electric field; and
    baking the middle thin film layer through a baking process to form the first ionic coordination compound layer.

9. The preparation method according to claim 6, wherein the forming the first ionic coordination compound layer comprises:
    depositing a middle thin film layer of ionic coordination compound on the hole transport layer; and
    baking the middle thin film layer through a baking process, and applying an external electric field in the baking process so that the first positive ion portion is on the side close to the hole transport layer, of the first ionic coordination compound layer, and a first negative ion portion is on the side close to the quantum dot luminescent layer, of the first ionic coordination compound layer to form the first ionic coordination compound layer.

10. The preparation method according to claim 7, wherein the depositing the middle thin film layer of ionic coordination compound on the hole transport layer comprises:
    depositing the middle thin film layer of ionic coordination compound on the hole transport layer through a spin-coating process; or,
    depositing the middle thin film layer of ionic coordination compound on the hole transport layer through an evaporation process.

11. A Quantum Dot Light Emitting Diode (QLED) display apparatus, comprising the QLED display panel according to claim 1.

12. The QLED display apparatus according to claim 11, wherein the QLED display panel further comprises at least one of following structures:
    a second ionic coordination compound layer formed on a side facing the electron transport layer, of the quantum dot luminescent layer, wherein the second ionic coordination compound layer comprises a second positive ion portion and a second negative ion portion, wherein the second positive ion portion is on a side close to the quantum dot luminescent layer, of the second ionic coordination compound layer, and the second negative ion portion is on a side close to the electron transport layer, of the second ionic coordination compound layer; and
    a third ionic coordination compound layer formed on a side facing the second electrode, of the electron transport layer, wherein comprises a third positive ion portion and a third negative ion portion, wherein the third positive ion portion is on a side close to the electron transport layer, of the third ionic coordination compound layer, and the third negative ion portion is on a side close to the second electrode, of the third ionic coordination compound layer.

13. The QLED display apparatus according to claim 11, wherein a material of the ionic coordination compound layers is an organic metal coordination compound.

14. The QLED display apparatus according to claim 13, wherein;
    the first positive ion portion comprises a central metal ion and a ligand of the central metal ion; the central metal ion comprises one of Ir, La, Nd, Eu, Cu, In, Pb or Pt; the ligand of the central metal ion comprises one of o-phenanthroline, an o-phenanthroline halide, 2-phenylpyridine, a 2-phenylpyridine halide, phenyloxadiazolypyridine, a phenyloxadiazolypyridine halide, phenylpyridine, a phenylpyridine halide, bipyridine, a bipyridine halide or a trihalomethyl substituendum; and
    the first negative ion portion comprises one of tetra (pentafluorophenyl)boric acid, a tetra(pentafluorophenyl)boric acid halide, tetra[(trifluoromethyl)phenyl]boric acid, a tetra[(trifluoromethyl)phenyl]boric acid halide, tetra[bis(trifluoromethyl)phenyl]boric acid, a tetra[bis(trifluoromethyl)phenyl]boric acid halide, hexa(pentafluorophenyl)phosphoric acid, a hexa(pentafluorophenyl)phosphoric acid halide, hexa[(trifluoromethyl)phenyl]phosphoric acid, a hexa[(trifluoromethyl)phenyl]phosphoric acid halide, hexa[bis(trifluoromethyl)phenyl]phosphoric acid and a hexa[bis(trifluoromethyl)phenyl]phosphoric acid halide or a trihalomethyl substituendum.

15. The QLED display apparatus according to claim 14, wherein the first positive ion portion comprises one of following structures:

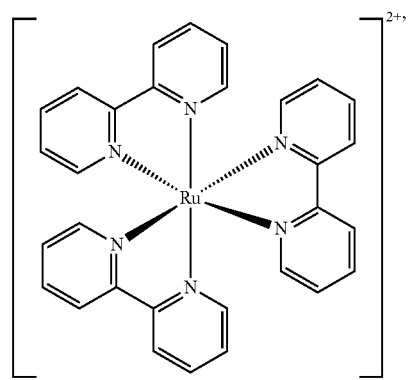

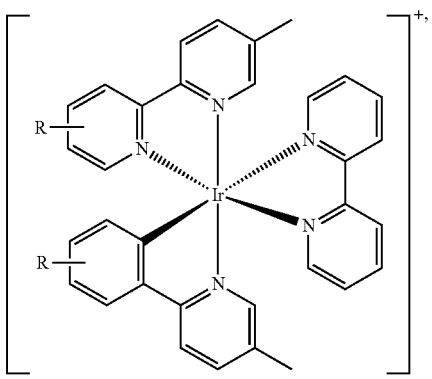

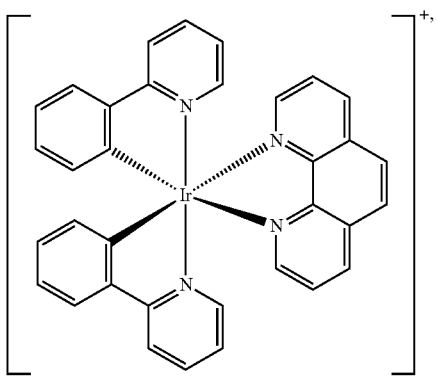

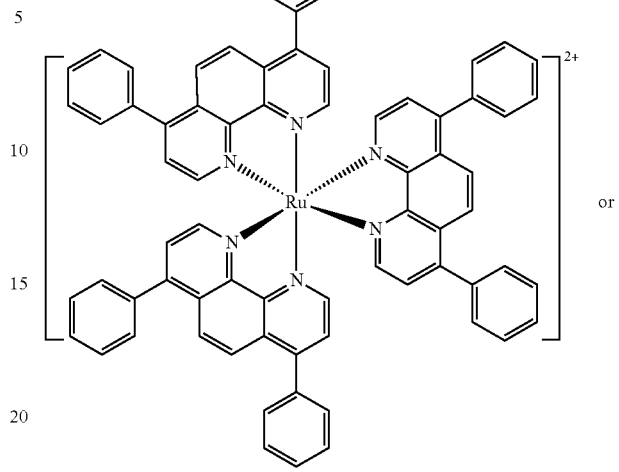

or

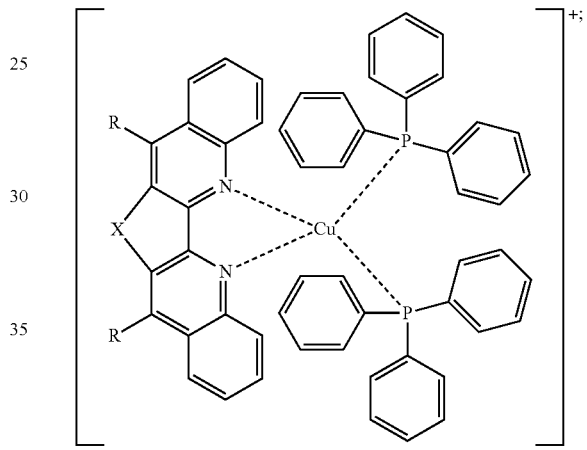

the first negative ion portion comprises one of following structures:

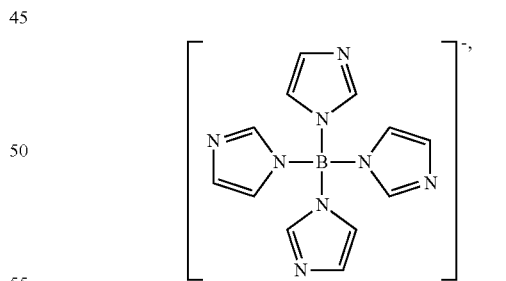

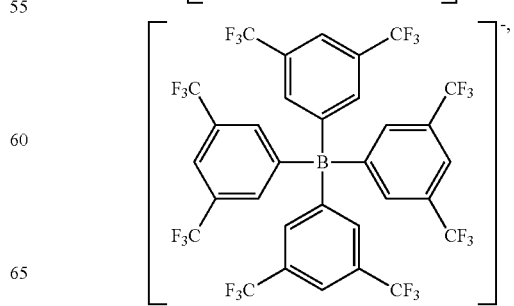

-continued
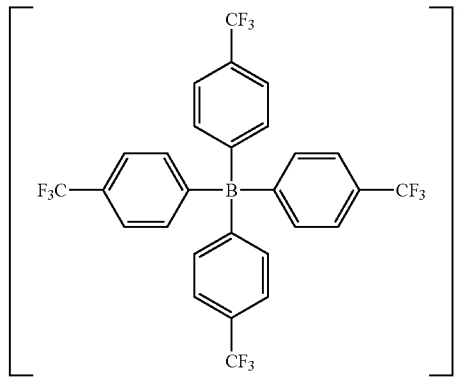
or
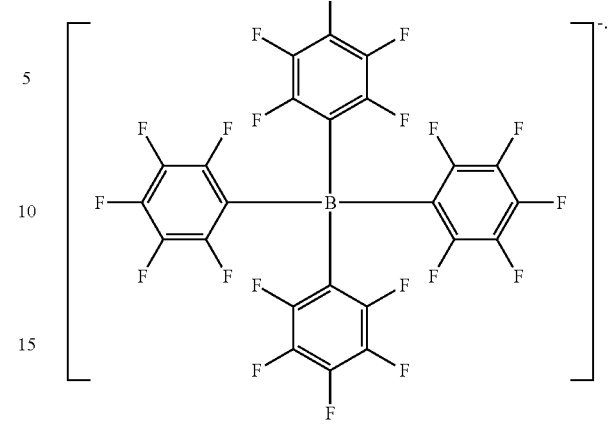
* * * * *